(12) United States Patent
Antonyan

(10) Patent No.: US 11,488,641 B2
(45) Date of Patent: Nov. 1, 2022

(54) MEMORY DEVICE INCLUDING VARIABLE REFERENCE RESISTOR AND METHOD OF CALIBRATING THE VARIABLE REFERENCE RESISTOR

(71) Applicant: SAMSUNG ELECTRONICS CO., LTD., Suwon-si (KR)

(72) Inventor: Artur Antonyan, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/120,405

(22) Filed: Dec. 14, 2020

(65) Prior Publication Data
US 2021/0383844 A1    Dec. 9, 2021

(30) Foreign Application Priority Data

Jun. 3, 2020    (KR) .................. 10-2020-0067315

(51) Int. Cl.
*G11C 7/04*    (2006.01)
*G11C 11/16*    (2006.01)

(52) U.S. Cl.
CPC ............ *G11C 7/04* (2013.01); *G11C 11/1673* (2013.01)

(58) Field of Classification Search
None
See application file for complete search history.

(56) References Cited

U.S. PATENT DOCUMENTS

| 7,643,889 | B2 | 1/2010 | Jeong et al. |
| 8,902,641 | B2 | 12/2014 | Chih et al. |
| 8,929,127 | B2 * | 1/2015 | Antonyan ........... G11C 11/1675 365/148 |
| 10,453,532 | B1 | 10/2019 | Antonyan |
| 10,482,959 | B2 | 11/2019 | Lee |
| 10,522,203 | B2 | 12/2019 | Jung |
| 2005/0156647 | A1 * | 7/2005 | Kim ......................... G11C 7/22 327/276 |
| 2012/0256772 | A1 * | 10/2012 | Wani ...................... G11C 5/145 341/110 |
| 2015/0063403 | A1 * | 3/2015 | Cho ..................... G01K 15/005 374/1 |
| 2015/0092469 | A1 * | 4/2015 | Kim ......................... G11C 7/14 365/148 |
| 2016/0179113 | A1 | 6/2016 | Taigor et al. |
| 2018/0095486 | A1 * | 4/2018 | Wan ......................... G05F 1/465 |

(Continued)

FOREIGN PATENT DOCUMENTS

WO    WO-2014044810 A1 *    3/2014    ....... H03K 19/00369

*Primary Examiner* — J. H. Hur
(74) *Attorney, Agent, or Firm* — Sughrue Mion, PLLC

(57) ABSTRACT

A memory device includes a cell array including a memory cell that includes a variable resistance element, a reference resistor configured to provide a resistance varying according to an adjustment code, and a read circuit configured to read data that is stored in the memory cell, based on a resistance of the variable resistance element and the resistance of the reference resistor. The memory device further includes a reference adjustment circuit configured to obtain a first calibration code corresponding to a temperature variation, and a second calibration code corresponding to a process variation, and perform an arithmetic operation on the obtained first calibration code and the obtained second calibration code, to obtain the adjustment code.

20 Claims, 17 Drawing Sheets

(56) References Cited

U.S. PATENT DOCUMENTS

| | | | |
|---|---|---|---|
| 2018/0143658 A1* | 5/2018 | McCarthy | G01K 7/01 |
| 2019/0044528 A1* | 2/2019 | Lu | H03M 1/1028 |
| 2019/0088299 A1 | 3/2019 | Antonyan et al. | |
| 2019/0088322 A1* | 3/2019 | Pyo | G11C 11/1673 |
| 2019/0348096 A1 | 11/2019 | Antonyan et al. | |

* cited by examiner

MEMORY DEVICE INCLUDING VARIABLE REFERENCE RESISTOR AND METHOD OF CALIBRATING THE VARIABLE REFERENCE RESISTOR

CROSS-REFERENCE TO THE RELATED APPLICATION

This application claims the benefit of Korean Patent Application No. 10-2020-0067315, filed on Jun. 3, 2020, in the Korean Intellectual Property Office, the disclosure of which is incorporated herein by reference in its entirety.

BACKGROUND

The inventive concept relates to a memory device, and more particularly, to a memory device including a variable reference resistor and a method of calibrating the variable reference resistor.

A resistive memory device may store data in a memory cell including a variable resistance element. To read the data stored in the memory cell, a resistance of the variable resistance element may be determined by providing a read current and/or a read voltage to the memory cell and detecting the read current and/or the read voltage. The data stored in the memory cell may be determined based on the resistance of the variable reference resistor and a resistance of a reference resistor. Resistive memory devices may be affected by variations in process, voltage, temperature, or the like, and compensating for such variations affect the operational reliability of the resistive memory devices.

SUMMARY

According to an aspect of the inventive concept, there is provided a memory device including a cell array including a memory cell that includes a variable resistance element, a reference resistor configured to provide a resistance varying according to an adjustment code, and a read circuit configured to read data that is stored in the memory cell, based on a resistance of the variable resistance element and the resistance of the reference resistor. The memory device further includes a reference adjustment circuit configured to obtain a first calibration code corresponding to a temperature variation, and a second calibration code corresponding to a process variation, and perform an arithmetic operation on the obtained first calibration code and the obtained second calibration code, to obtain the adjustment code.

According to another aspect of the inventive concept, there is provided a memory device including a cell array including a first memory cell group and a second memory cell group, a first reference resistor configured to provide a first resistance varying according to a first adjustment code, to read data that is stored in the first memory cell group, and a second reference resistor configured to provide a second resistance varying according to a second adjustment code, to read data that is stored in the second memory cell group. The memory device further includes a first reference adjustment circuit configured to obtain a first calibration code corresponding to a temperature variation, and a second calibration code corresponding to a process variation, and perform an arithmetic operation on the obtained first calibration code, the obtained second calibration code, and a third calibration code corresponding to a characteristic of the first memory cell group, to obtain the first adjustment code, and a second reference adjustment circuit configured to perform an arithmetic operation on the obtained first calibration code, the obtained second calibration code, and a fourth calibration code corresponding to a characteristic of the second memory cell group, to obtain the second adjustment code.

According to another aspect of the inventive concept, there is provided a method of calibrating a reference resistor included in a resistive memory device, the method including obtaining a first calibration code corresponding to a temperature variation, obtaining a second calibration code corresponding to a process variation, and performing an arithmetic operation on the obtained first calibration code and obtained the second calibration code, to obtain an adjustment code. The method further includes adjusting a resistance of the reference resistor, based on the obtained adjustment code.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

The inventive concept relates to a memory device, and provides a memory device compensating for variations by adjusting a resistance of a reference resistor and a method of calibrating the reference resistor.

Figure 1:
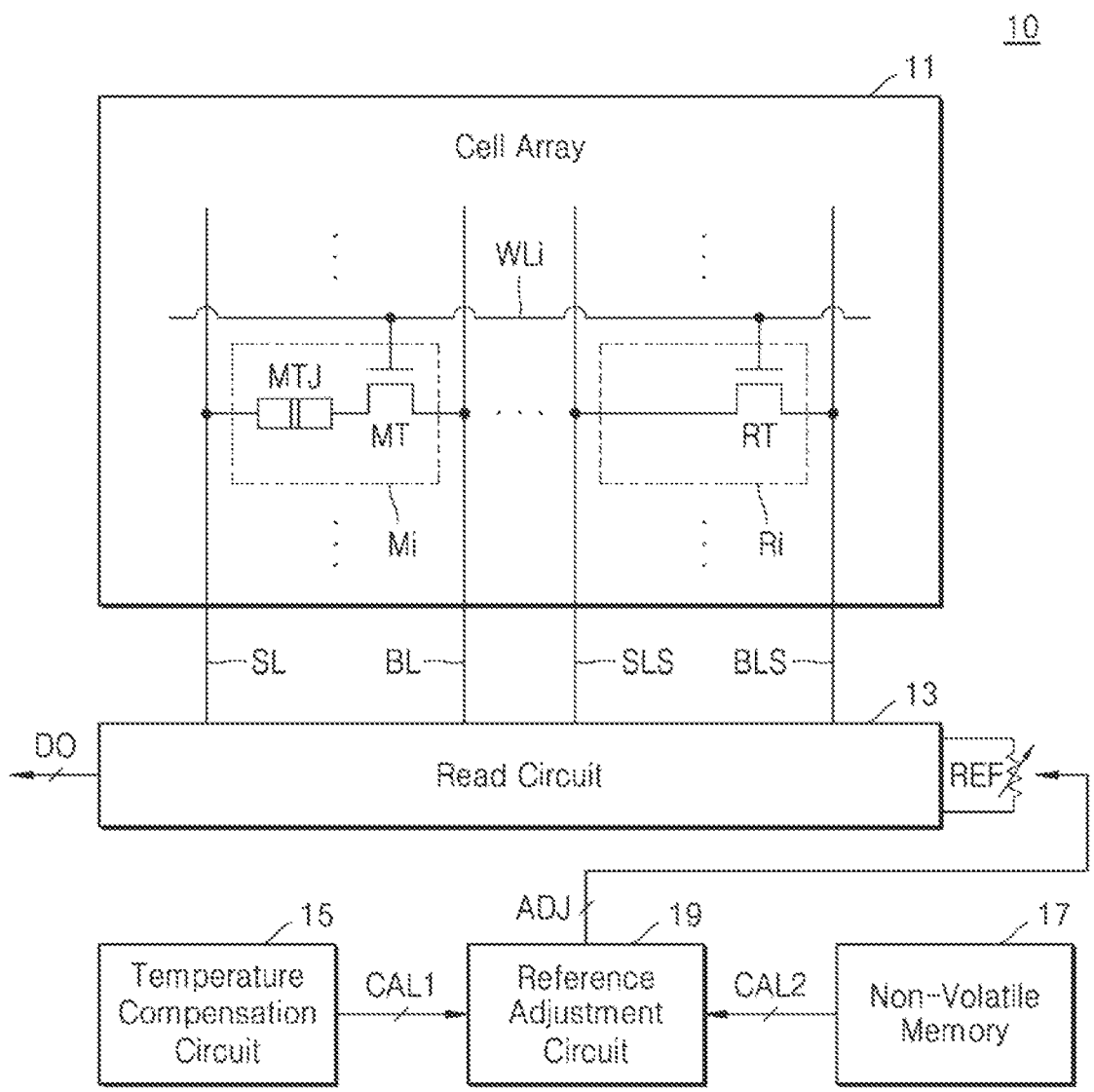
FIG. 1 is a block diagram of a memory device according to an example embodiment.

FIG. 1 is a block diagram of a memory device 10 according to an example embodiment. Referring to FIG. 1, the memory device 10 may include a cell array 11, a read circuit 13, a temperature compensation circuit 15, a non-volatile memory 17, a reference adjustment circuit 19, and a reference resistor REF.

The memory device 10 may receive commands and addresses from the outside, and may receive or output data. For example, the memory device 10 may receive a write command or a read command, and may receive an address corresponding to an command. The memory device 10 may receive data in response to a write command, and may output data in response to a read command. In some embodiments, commands, addresses, and data may be received or transferred through independent channels, respectively. In some embodiments, at least two of commands, addresses and data may be received or transferred through the same channel. Herein, an operation performed by the memory device 10 in response to a write command may be referred to as a write operation, and an operation performed by the memory device 10 in response to a read command may be referred to as a read operation.

The cell array 11 may include a plurality of memory cells and a plurality of reference cells. For example, as illustrated in FIG. 1, the cell array 11 may include a memory cell Mi and a reference cell Ri, which are commonly connected to a word line WLi. The memory cell Mi may include a variable resistance element MTJ and a memory cell transistor MT, which are connected in series between a source line SL and a bit line BL. In some embodiments, the variable resistance element MTJ and the memory cell transistor MT may be connected in series between the source line SL and the bit line BL in an order different from that as shown in FIG. 1. The memory cell transistor MT may have a gate connected to the word line WLi, and may electrically connect the variable resistance element MTJ to the bit line BL in response to an activated word line WLi, for example, a high level of voltage applied to a word line WLi.

The variable resistance element MTJ may have a resistance corresponding to a value stored in a memory cell. Accordingly, the memory device 10 may be referred to as a resistive memory device, a resistive random access memory (RRAM or ReRAM) device, or the like. For example, the cell array 11 may, as a non-limiting example, include a memory cell having a structure of a phase change memory, a phase change memory and switch (PCMS), a resistive random access memory (RRAM), a ferroelectric memory, a spin-tranfer torque random access memory (STT-RAM), a spin tunneling random access memory (STRAM), a magnetoresistive memory, a magnetic memory, a magnetic random access memory (MRAM), and a semiconductor-oxide-nitride-oxide-semiconductor (SONOS) memory.

In some embodiments, the variable resistance element MTJ may be a magnetic tunnel junction (MTJ) element. For example, the variable resistance element MTJ may include a free layer and a pinned layer, and may include a barrier layer between the free layer and the pinned layer. The magnetization direction of the pinned layer may be fixed, and the free layer may have a magnetization direction that is the same as that of the pinned layer or a magnetization direction opposite to that of the pinned layer. When the pinned layer and the free layer have the same magnetization directions, the variable resistance element MTJ may be referred to as being in a parallel state. When the pinned layer and the free layer have magnetization directions opposite to each other, the variable resistance element MTJ may be referred to as being in an anti-parallel state. In some embodiments, the variable resistance element MTJ may further include an anti-ferromagnetic layer such that the pinned layer has a fixed magnetization direction.

The variable resistance element MTJ may have a relatively low resistance in the parallel state, and may have a relatively high resistance in the anti-parallel state. Herein, a low resistance of the variable resistance element MTJ in the parallel state may be referred to as a parallel resistance $R_P$, and when the variable resistance element MTJ has the parallel resistance $R_P$, the memory cell Mi is assumed to store '0'. In addition, a high resistance of the variable resistance element MTJ in the anti-parallel state may be referred to as an anti-parallel resistance $R_{AP}$, and when the variable resistance element MTJ has the anti-parallel resistance $R_{AP}$, the memory cell Mi is assumed to store '1'.

The reference cell Ri may include a reference cell transistor RT connected between a reference source line SLS and a reference bit line BLS. The reference cell transistor RT may have a gate connected to the word line WLi, and may electrically connect the reference source line SLS to the reference bit line BLS in response to an activated word line WLi, for example, a high level of voltage applied to the word line WLi. Accordingly, the reference cell Ri may be referred to as a short cell or a shorted bit cell.

The read circuit 13 may determine data stored in the memory cell Mi and output output data DO, based on a resistance of the variable resistance element MTJ and a resistance of the reference resistor REF, that is, a reference resistance $R_{REF}$. For example, the read circuit 13 may electrically connect the reference resistor REF between the reference bit line BLS and a ground node (or a negative supply voltage node), and may compare the resistance of the variable resistance element MTJ to the reference resistance $R_{REF}$ by providing a read voltage and/or a read current to the source line SL and the reference source line SLS.

As illustrated in FIG. 1, the reference resistor REF arranged outside the cell array 11 may be free from a structural constraint of the cell array 11, and the reference resistor REF may include a different material (for example, polysilicon) from the variable resistance element MTJ. Accordingly, the reference resistor REF may be easily formed to have a desired resistance, for example, the reference resistance $R_{REF}$ corresponding to a median of the parallel resistance $R_P$ and the anti-parallel resistance $R_{AP}$ ($R_{REF}=(R_P+R_{AP})/2$), and may also be relatively less sensitive to a process voltage temperature (PVT) variation. As illustrated in FIG. 1, the reference resistor REF may receive an adjustment code ADJ from the reference adjustment circuit 19 and have a variable resistance according to the adjustment code ADJ, and may be referred to as a variable reference resistor. The reference resistor REF may have an arbitrary structure providing a resistance varying according to the adjustment code ADJ, which is a multi-bit digital signal. For example, the reference resistor REF may include a plurality of resistors and a plurality of switches, and the plurality of switches may add or exclude the plurality of resistors in or from a path between two ends of the reference resistor REF according to bits of the adjustment code ADJ. As a result, the reference resistance $R_{REF}$ may be determined by the adjustment code ADJ.

Various variations may occur in the memory device 10. For example, the memory device 10 may have a different characteristic from other memory devices manufactured by the same semiconductor process, the characteristic may vary according to the level of voltage provided to the memory device 10, and the characteristic may vary according to the temperature of the memory device 10. Compensating for such variations may be a factor for the reliability of the memory device 10, and accordingly, the memory device 10 may include a structure for compensating for variations. As will be described below, the resistance of the reference resistor REF, that is, the reference resistance $R_{REF}$, may be adjusted to compensate for variations that occurred in the memory device 10, and accordingly, various variations may be compensated for by a simple structure, and as a result, the cost of compensating for variations, such as an area, power, and time, may be reduced. In addition, addition of the structure for compensating for variations may be limited even when the capacity of the memory device 10, that is, the size of the cell array 11, is increased.

The temperature compensation circuit 15 may generate a first calibration code CAL1 based on the temperature of the memory device 10. That is, the first calibration code CAL1 may be generated to compensate for a temperature variation of the memory device 10. The first calibration code CAL1 may be a multi-bit signal as a digital signal, and may be provided to the reference adjustment circuit 19. Examples of the temperature compensation circuit 15 will be described below with reference to FIG. 2 or the like.

The non-volatile memory 17 may provide, to the reference adjustment circuit 19, a second calibration code CAL2 corresponding to a process variation of the memory device 10. For example, the memory device 10 may be tested in a manufacturing process, and a value of the second calibration code CAL2 corresponding to a test result may be written to the non-volatile memory 17. The non-volatile memory 17 may not lose stored data even when power supply to the memory device 10 is cut off. For example, the non-volatile memory 17 may be a rewritable memory such as flash memory, electrically erasable programmable read-only memory (EEPROM), or the like, and may be an one time programmable (OTP) memory such as an antifuse array, electrically programmable read-only memory (EPROM), or the like. In some embodiments, the non-volatile memory 17 may store not only the second calibration code CAL2, but also store a value of an offset code OFF described below with reference to FIGS. 4A and 4B, and may also store lookup tables 62a and 62b of FIGS. 6A and 6B and as well as a third calibration code CAL3 of FIG. 10A.

The reference adjustment circuit 19 may generate the adjustment code ADJ by performing an arithmetic operation on the first calibration code CAL1 provided from the temperature compensation circuit 15 and the second calibration code CAL2 provided from the non-volatile memory 17. For example, the reference adjustment circuit 19 may generate the adjustment code ADJ by adding the first and second calibration codes CAL1 and CAL2. Accordingly, compensation for variations in the memory device 10 may be performed by digital signals, and a reduced area, power, and time may be possible for compensating for variations as compared to a case in which an analog circuit is used to compensate for variations. Examples of the reference adjustment circuit 19 will be described below with reference to FIG. 7 or the like.

Figure 2:
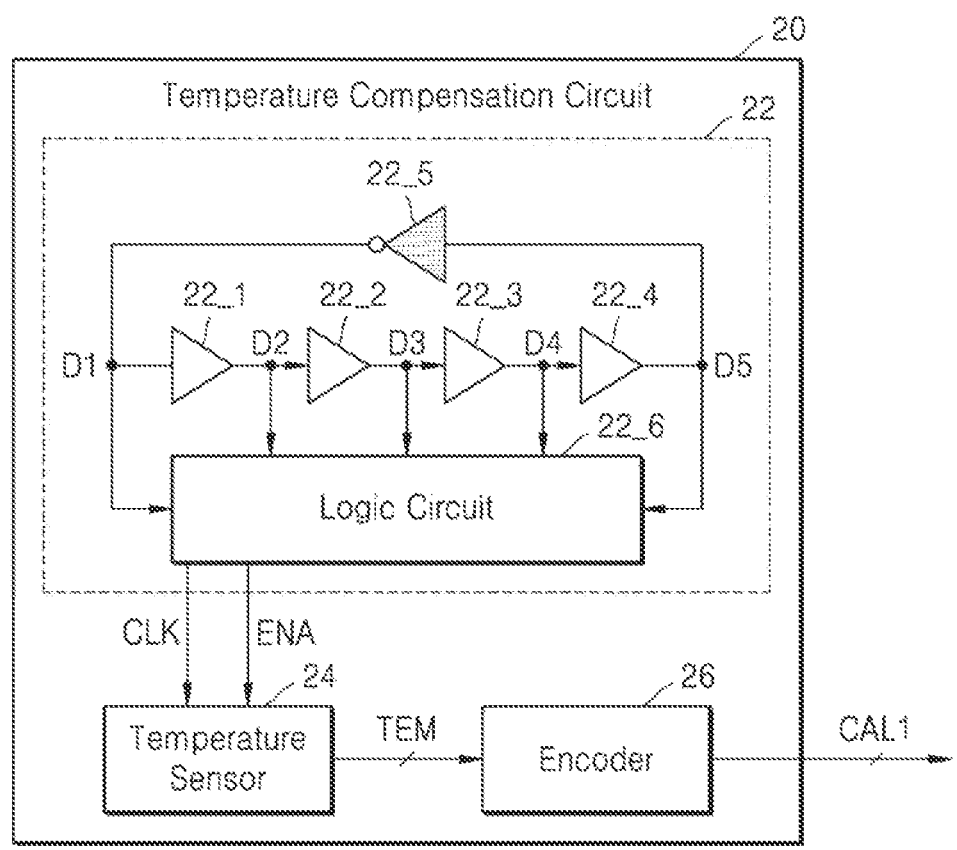
FIG. 2 is a block diagram of a temperature compensation circuit according to an example embodiment.

FIG. 2 is a block diagram of a temperature compensation circuit 20 according to an example embodiment. As described above with reference to FIG. 1, the temperature compensation circuit 20 may generate the first calibration code CAL1 corresponding to a temperature variation. As illustrated in FIG. 2, the temperature compensation circuit 20 may include a controller 22, a temperature sensor 24, and an encoder 26.

The controller 22 may generate an enable signal ENA and a clock signal CLK to control the temperature sensor 24. As illustrated in FIG. 2, the controller 22 may include a ring oscillator and a logic circuit 22_6, wherein the ring oscillator includes first through fifth delay cells 22_1 through 22_5. In some embodiments, the ring oscillator may include a different number of delay cells from that as shown in FIG. 2. As illustrated in FIG. 2, the ring oscillator may generate first through fifth signals D1 through D5, and the logic circuit 22_6 may generate, from the first through fifth signals D1 through D5, the enable signal ENA periodically activated and the clock signal CLK oscillating while the enable signal ENA is activated. As will be described below with reference to FIG. 3, to generate the enable signal ENA having a lower duty cycle, for example, a duty cycle equal to or less than 5%, the fifth delay cell 22_5 may provide a delay (for example, several microseconds or several milliseconds) longer than a delay (for example, tens or hundreds of ns) provided by each of the first through fifth delay cells 22_1 through 22_5. Any one or any combination of the first through fifth delay cells 22_1 through 22_5 may generate an output signal inverted from an input signal. For example, the fifth delay cell 22_5 may generate the first signal D1 by inverting the fifth signal D5, as shown in FIG. 2.

In some embodiments, the controller 22 may receive a reset signal. For example, the memory device 10 of FIG. 1 may include a circuit generating a reset signal that appropriately enables components after power supply is started. The controller 22 may receive the reset signal, and when the reset signal is deactivated, may generate the first through fifth signals D1 through D5, which oscillate. For example, when the reset signal is an active-low signal, the controller 22 may further include an AND gate receiving the first signal D1 and the reset signal and providing an output signal to the first delay cell 22_1.

The temperature sensor 24 may generate a temperature code TEM by sensing the temperature of the memory device 10. The temperature code TEM may represent a sensed temperature, that is, the temperature of the memory device 10, and be provided to the encoder 26. In some embodiments, the temperature sensor 24 may generate the temperature code TEM based on a binary search or a successive approximation, and may receive the clock signal CLK for the generation of the temperature code TEM. For example, the temperature sensor 24 may use k cycles of the clock signal CLK to generate a k-bit temperature code TEM (wherein, k is an integer greater than 1), and may sequentially determine bits of the temperature code TEM. The temperature sensor 24 may have an arbitrary structure for sensing temperature, and examples of the temperature sensor 24 will be described below with reference to FIGS. 4A and 4B.

The encoder 26 may receive the temperature code TEM from the temperature sensor 24, and may generate the first calibration code CAL1 based on the temperature code TEM. In some embodiments, the encoder 26 may generate the first calibration code CAL1, which is non-linear to temperature, based on the temperature code TEM. Examples of the encoder 26 will be described below with reference to FIGS. 6A and 6B.

Figure 3:
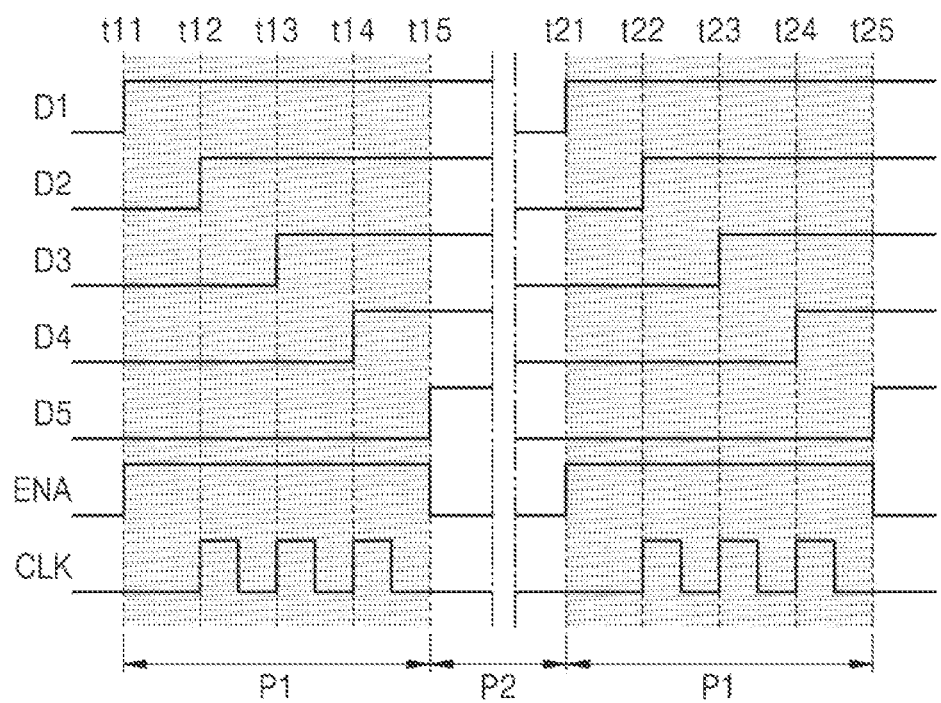
FIG. 3 is a timing diagram illustrating an example of an operation of the temperature compensation circuit of FIG. 2, according to an example embodiment.

FIG. 3 is a timing diagram illustrating an example of an operation of the temperature compensation circuit 20 of FIG. 2, according to an example embodiment. In detail, the timing diagram of FIG. 3 illustrates the signals of FIG. 2 over time. Herein, the signals are assumed to be active-high signals having a high level when activated. Hereinafter, FIG. 3 is described with reference to FIG. 2.

Referring to FIG. 3, the first signal D1 may transit from a low level to a high level at time t11. A rising edge of the first signal D1 may be delayed by the first through fourth delay cells 22_1 through 22_4, and accordingly, rising edges of the second, third, fourth, and fifth signals D2, D3, D4, and D5 may respectively occur at time t12, time t13, time t14, and time t15. The fifth delay cell 22_5 may generate the first signal D1 by inverting the fifth signal D5. As described above with reference to FIG. 2, because the fifth delay cell 22_5 may provide a long delay, a falling edge of the first signal D1 may occur after a long time, for example, several microseconds or several milliseconds, has elapsed from time t15. The falling edge of the first signal D1 may be delayed by the first through fourth delay cells 22_1 through 22_4, and the rising edge of the first signal D1 may occur again at time t21 in which several microseconds or several milliseconds have elapsed from the time when a falling edge of the fifth signal D5 occurs. Next, similar to time t12 through time t15, the rising edges of the second, third, fourth, and fifth signals D2, D3, D4, and D5 may sequentially occur again at time t22, time t23, time t24, and time t25.

The logic circuit 22_6 may generate the enable signal ENA based on the first through fifth signals D1 through D5. For example, as shown in FIG. 3, the enable signal ENA may be activated at time t11 in response to the rising edge of the first signal D1, and may be deactivated at time t15 in response to the falling edge of the fifth signal D5. Accordingly, a first period P1 in which the enable signal ENA is activated may correspond to a delay provided by the first through fourth delay cells 22_1 through 22_4, and a second period P2 in which the enable signal ENA is deactivated may correspond to a sum of a delay provided by the fifth delay cell 22_5 and the delays provided by the first through fourth delay cells 22_1 through 22_4 by two times and. Therefore, an operation of sensing the temperature may be performed in the first period P1, and may be performed in a period corresponding to a sum of the first period P1 and the second period P2. As described above with reference to FIG. 2, the delays provided by each of the first through fifth delay cells 22_1 through 22_5 may be determined such that the enable signal ENA has a low duty cycle, for example, a duty cycle equal to or less than 5% (that is, $P1/(P1+P2) \leq 0.05$), and as a result, time and power consumed to compensate for a temperature variation may be reduced. The logic circuit 22_6 may generate the enable signal ENA having a low duty cycle in various methods. For example, the logic circuit 22_6 may generate the enable signal ENA further based on the clock signal CLK in addition to the first and fifth signals D1 and D5.

The logic circuit 22_6 may generate the clock signal CLK based on the rising edges of the first through fifth signals D1 through D5. For example, as illustrated in FIG. 3, the logic circuit 22_6 may generate the clock signal CLK having rising edges synchronized with the rising edges of the second through fourth signals D2 through D4. In some embodiments, the logic circuit 22_6 may include edge detectors detecting the rising edges of the second through fourth signals D2 through D4, and may generate the clock signal CLK by combining outputs of the edge detectors. In some embodiments, different from that as illustrated in FIG. 3, the logic circuit 22_6 may generate the clock signal CLK having four or more rising edges while the enable signal ENA is activated.

Figure 4A:
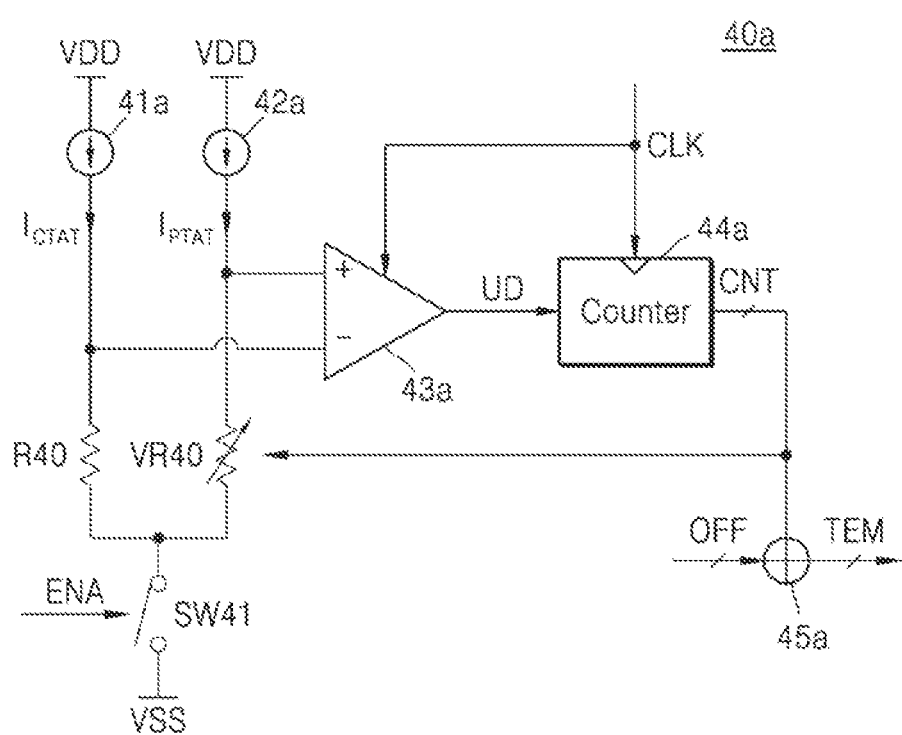
FIGS. 4A and 4B are block diagrams of examples of a temperature sensor according to example embodiments.
Figure 4B:
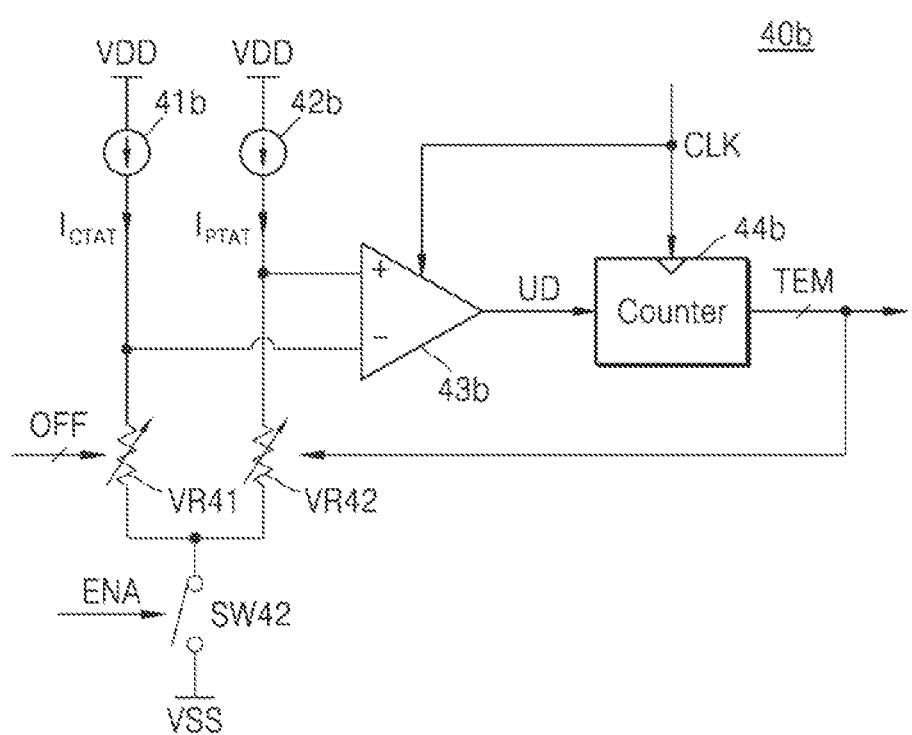

FIGS. 4A and 4B are block diagrams of examples of a temperature sensor according to example embodiments. In detail, the block diagrams of FIGS. 4A and 4B illustrate temperature sensors 40a and 40b generating the temperature code TEM based on the binary search or the successive approximation. As described above with reference to FIG. 2, the temperature sensors 40a and 40b may receive the clock signal CLK and the enable signal ENA, and may further receive the offset code OFF. Hereinafter, descriptions previously given may be omitted from the descriptions of FIGS. 4A and 4B.

Referring to FIG. 4A, the temperature sensor 40a may include first and second current sources 41a and 42a, a resistor R40, a variable resistor VR40, a switch SW41, a comparator 43a, a counter 44a, and an adder 45a. The first current source 41a may generate a complementary-to-absolute-temperature (CTAT) current $I_{CTAT}$ from a positive supply voltage VDD, and the second current source 42a may generate a proportional-to-absolute-temperature (PTAT) current $I_{PTAT}$ from the positive supply voltage VDD. The CTAT current $I_{CTAT}$ and the PTAT current $I_{PTAT}$ may be respectively provided to the resistor R40 and the variable resistor VR40, and may flow to a ground potential (or a negative supply voltage) VSS through the switch SW41. The switch SW41 may be turned on in response to the enable signal ENA, which is activated, and accordingly, power consumption of the temperature sensor 40a may be reduced when the enable signal ENA is deactivated.

The comparator 43a may compare a voltage generated by the CTAT current $I_{CTAT}$ and the resistor R40 with a voltage generated by the PTAT current $I_{PTAT}$ and the variable resistor VR40, and may generate an up-down signal UD according to a comparison result. In addition, the comparator 43a may receive the clock signal CLK and may update the up-down signal UD in synchronization with the clock signal CLK, for example, in response to the rising edge of the clock signal CLK. The counter 44a is an up-down counter that operates in synchronization with the clock signal CLK, and may generate a count code CNT, which increase or decreases according to the up-down signal UD provided from the comparator 43a. As illustrated in FIG. 4A, the count code CNT may be provided to the variable resistor VR40, and the variable resistor VR40 may provide a resistance adjusted according to the count code CNT.

An offset may occur due to any one or any combination of components processing an analog signal in the temperature sensor 40a, for example, the first and second current sources 41a and 42a, the resistor R40, the variable resistor VR40, and the comparator 43a. To compensate for the offset, the temperature sensor 40a may receive the offset code OFF, and the adder 45a may generate the temperature code TEM by adding the count code CNT to the offset code OFF. In some embodiments, the temperature sensor 40a may include, instead of the adder 45a, a subtractor that subtracts the offset code OFF from the count code CNT. In some embodiments, the offset code OFF may be provided from the non-volatile memory 17 of FIG. 1.

Referring to FIG. 4B, the temperature sensor 40b may include first and second current sources 41b and 42b, first and second variable resistors VR41 and VR42, a switch SW42, a comparator 43b, and a counter 44b. Compared with the temperature sensor 40a of FIG. 4A, the CTAT current $I_{CTAT}$ may be provided to the first variable resistor VR41, and the offset code OFF may be provided to the first variable resistor VR41. The first variable resistor VR41 may provide a resistance adjusted according to the offset code OFF. Accordingly, an offset generated in the temperature sensor 40b may be compensated by the first variable resistor VR41, and the temperature code TEM may be generated by the counter 44b.

Figure 5:
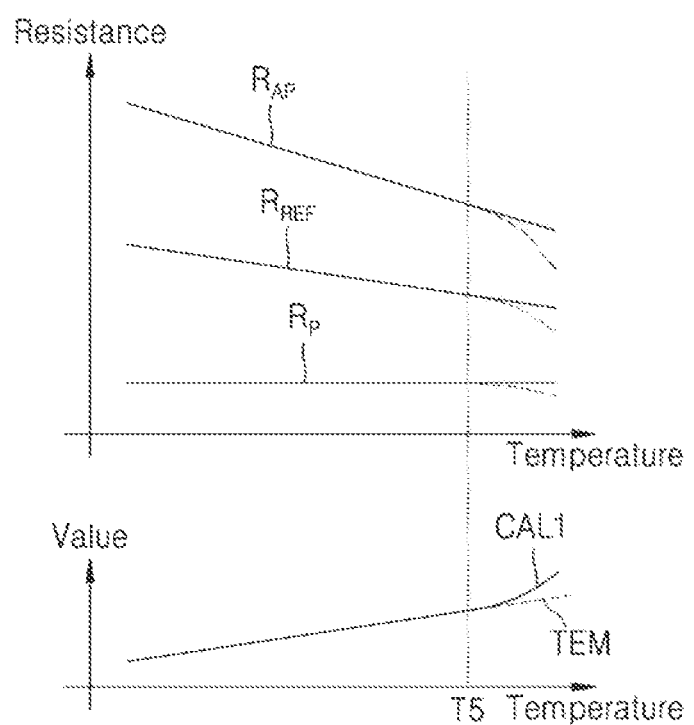
FIG. 5 is a graph illustrating a temperature characteristic of a memory device according to an example embodiment.

FIG. 5 is a graph illustrating a temperature characteristic of a memory device according to an example embodiment. In detail, the upper graph of FIG. 5 shows the parallel resistance $R_P$, the anti-parallel resistance $R_{AP}$, and the reference resistance $R_{REF}$ according to a temperature of the memory device 10 and the lower graph of FIG. 5 shows the temperature code TEM and the first calibration code CAL1 according to the temperature. Hereinafter, FIG. 5 is described with reference to FIG. 1.

In some embodiments, the variable resistance element MTJ may have a resistance that decreases as the temperature increases. For example, as illustrated in FIG. 5, the parallel resistance $R_P$ may remain approximately constant even when a temperature rises to a temperature T5, and the anti-parallel resistance $R_{AP}$ may decrease as the temperature rises to the temperature T5. Accordingly, as illustrated in FIG. 5, the reference resistance $R_{REF}$ that decreases as the temperature rises to the temperature T5 is used, and to this end, therefore the first calibration code CAL1 may increase as the temperature rises to the temperature T5. In some embodiments, different from that as illustrated in FIG. 5, the first calibration code CAL1 may decrease as the temperature rises to the temperature T5.

In the memory device 10, an amount of leakage current may increase when a read operation is performed at a high temperature. For example, the read circuit 13 may, during the read operation, provide a positive read voltage to the source line SL and provide a ground potential to the bit line BL. In addition, the read circuit 13 may, during the read operation, provide the positive read voltage to the reference source line SLS and provide a ground potential to the reference bit line BLS through the reference resistor REF. Accordingly, the voltage of the reference source line SLS may be greater than the voltage of the source line SL during the read operation. As a result, a voltage corresponding to a read voltage may be applied to memory cells including the memory cell Mi and connected to the source line SL and the bit line BL, and a voltage having a level less than the read voltage may be applied to reference cells including the reference cell Ri and connected to the reference source line SLS and reference bit line BLS.

Memory cell transistor included in each of non-selected memory cells, that is, memory cells connected to deactivated word lines, may receive a source-drain voltage greater than that of reference cell transistor included in each of non-selected reference cells. Accordingly, at a high temperature, a leakage current flowing from the source line SL to the bit line BL through the non-selected memory cells may be greater than a leakage current flowing from the reference source line SLS to the reference bit line BLS through the non-selected reference cells. As a result, as illustrated by dashed lines in FIG. 5, a resistance of the variable resistance element MTJ that radically decreases at the temperature T5 or higher may be sensed in the read circuit 13, and the reference resistance $R_{REF}$ that radically decreases at the temperature T5 or higher may be used for a read operation. To this end, as illustrated in FIG. 5, the first calibration code CAL1 may, at the temperature T5 or higher, increase more than the temperature code TEM that increases in proportion to a temperature. That is, the first calibration code CAL1 may, at the temperature T5 or higher, increase non-linearly with a temperature. Examples of the encoder 26 of FIG. 2 for generating the first calibration code CAL1 as shown in FIG. 5 from the temperature code TEM will be described below with reference to FIGS. 6A and 6B.

Figure 6A:
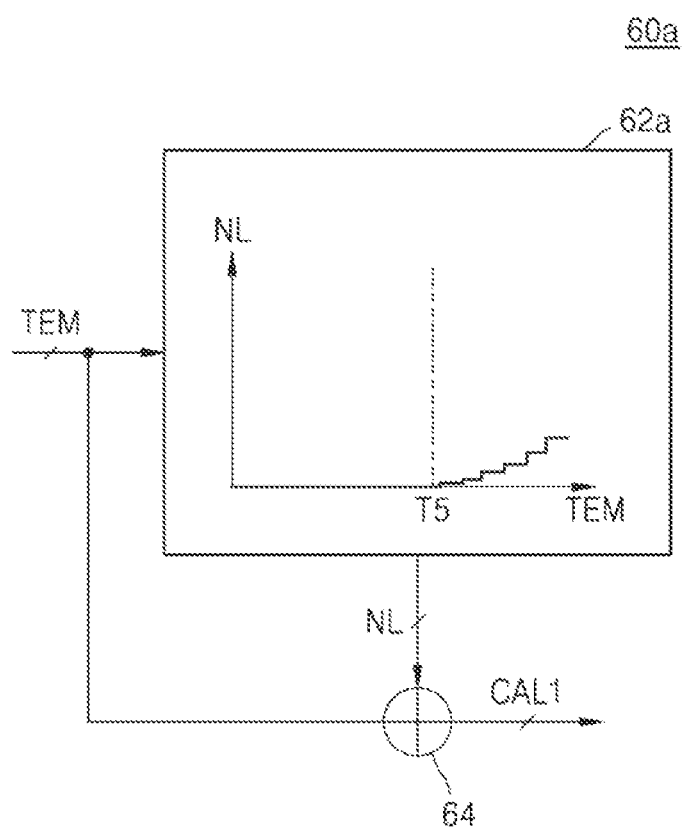
FIGS. 6A and 6B are block diagrams of examples of an encoder according to example embodiments.
Figure 6B:
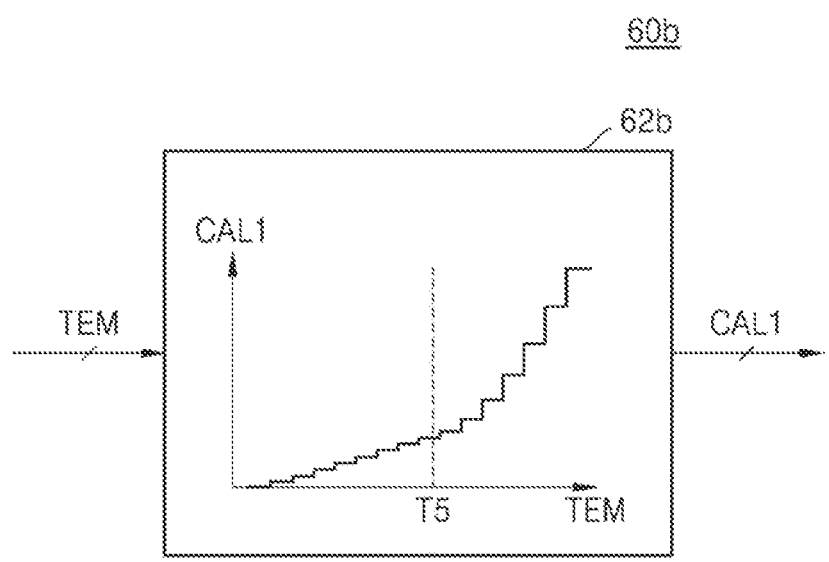

FIGS. 6A and 6B are block diagrams of examples of an encoder according to example embodiments. As described above with reference to FIG. 2, encoders 60a and 60b of FIGS. 6A and 6B may generate the first calibration code CAL1 from the temperature code TEM. In some embodiments, as described above with reference to FIG. 5, the encoders 60a and 60b may, at the temperature T5 or higher, generate the first calibration code CAL1 that increases non-linearly with temperature.

Referring to FIG. 6A, the encoder 60a may include a lookup table 62a and an adder 64. The lookup table 62a may include offset values corresponding to values of the temperature code TEM. For example, as illustrated in FIG. 6A, when the temperature code TEM corresponds to a temperature, which is lower than the temperature T5, the lookup table 62a may output a non-linear code NL of zero, and when the temperature code TEM corresponds to a temperature, which is higher than the temperature T5, the lookup table 62a may output a non-linear code NL that increases non-linearly with the temperature code TEM. The adder 64 may generate the first calibration code CAL1 by adding the non-linear code NL to the temperature code TEM. In some embodiments, the encoder 60a may include, instead of the lookup table 62a, a calculator that calculates the non-linear code NL from the temperature code TEM. In addition, in some embodiments, the lookup table 62a may be stored in the non-volatile memory 17 of FIG. 1, and the encoder 60a may obtain the non-linear code NL by providing the temperature code TEM to the non-volatile memory 17 of FIG. 1.

Referring to FIG. 6B, the encoder 60b may include a lookup table 62b. Compared with the lookup table 62a of FIG. 6A, the lookup table 62b of FIG. 6B may include values of the first calibration code CAL1 corresponding to values of the temperature code TEM. For example, as illustrated in FIG. 6B, when the temperature code TEM has a value corresponding to a temperature, which is lower than the temperature T5, the lookup table 62b may output the first calibration code CAL1 having a value that is same with the temperature code TEM, and when the temperature code TEM has a value corresponding to a temperature, which is higher than the temperature T5, the lookup table 62b may output the first calibration code CAL1 that has a value greater than the temperature code TEM and increases non-linearly with the temperature code TEM. In some embodiments, the encoder 60b may include, instead of the lookup table 62b, a calculator that calculates the first calibration code CAL1 from the temperature code TEM. In addition, in some embodiments, the lookup table 62b may be stored in the non-volatile memory 17 of FIG. 1, and the encoder 60b may obtain the first calibration code CAL1 by providing the temperature code TEM to the non-volatile memory 17 of FIG. 1.

Figure 7:
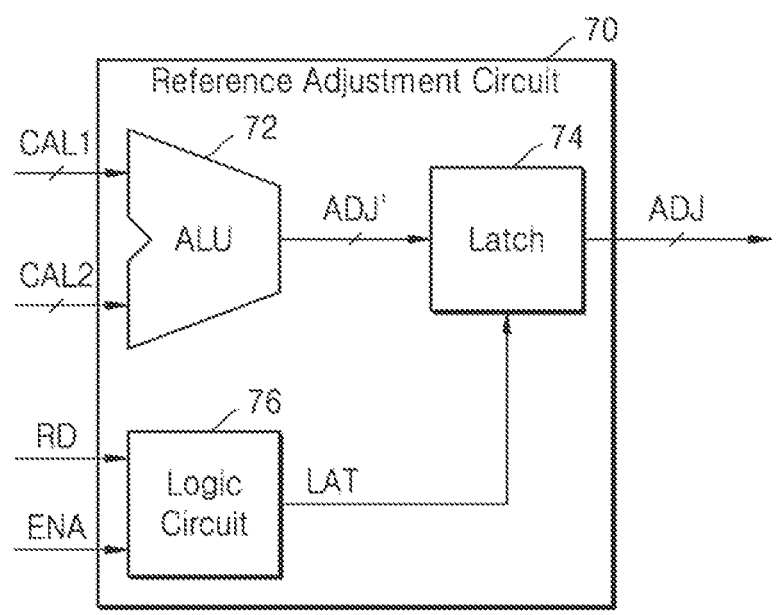
FIG. 7 is a block diagram of a reference adjustment circuit according to an example embodiment.
Figure 8:
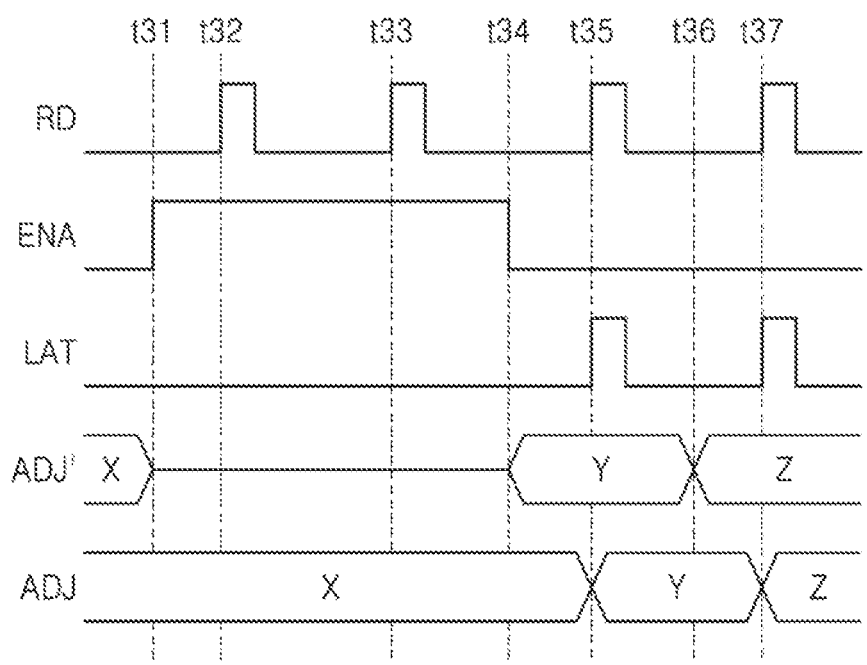
FIG. 8 is a timing diagram illustrating an example of an operation of the reference adjustment circuit of FIG. 7, according to an example embodiment.

FIG. 7 is a block diagram of a reference adjustment circuit 70 according to an example embodiment. FIG. 8 is a timing diagram illustrating an example of an operation of the reference adjustment circuit 70 of FIG. 7 according to an example embodiment.

Referring to FIG. 7, the reference adjustment circuit 70 may receive the first and second calibration codes CAL1 and CAL2, and may generate the adjustment code ADJ, as described above with reference to FIG. 1. The reference adjustment circuit 70 may further receive a read signal RD and an enable signal ENA, and may include an arithmetic logic unit (ALU) 72, a latch 74, and a logic circuit 76.

The ALU 72 may generate an output code ADJ' by performing an arithmetic operation on the first and second calibration codes CAL1 and CAL2. For example, the ALU 72 may include an adder, and may output the output code ADJ' by adding the first and second calibration codes CAL1 and CAL2. The latch 74 may be referred to as a register, and may latch the output code ADJ' provided from the ALU 72 in response to a latch signal LAT, and may output a latched value as the adjustment code ADJ.

The logic circuit 76 may generate the latch signal LAT from the read signal RD and the enable signal ENA. The read signal RD may be referred to as a signal activated according to a read command received from the outside of the memory device 10 of FIG. 1, and the enable signal ENA may be activated while updating the first calibration code CAL1 by sensing the temperature of the memory device 10, as described above with reference to FIGS. 2 and 3, or the like. The logic circuit 76 may generate the latch signal LAT such that the latch 74 latches the output code ADJ' of the ALU 72 in response to the read signal RD, which is activated, while the enable signal ENA is deactivated.

Referring to FIG. 8, the enable signal ENA is activated at time t31, and accordingly, an operation of updating the first calibration code CAL1 may be started. The value of the first calibration code CAL1 may vary in a period in which the enable signal ENA is activated, that is, from time t31 to time t34, and may be finally determined as a value Y at time t34. Accordingly, before the final value Y of the first calibration code CAL1 is determined, that is, in a period in which the enable signal ENA is activated, the first calibration code CAL1 may have an invalid value, and the output code ADJ' of the ALU 72 may also have an invalid value. The logic circuit 76 may maintain the latch signal LAT, which is deactivated such that the latch 74 does not latch the invalid output code ADJ' of the ALU 72, despite the read signal RD activated at each of the time t32 and time t33. Accordingly, the adjustment code ADJ may maintain the value X while the enable signal ENA is activated.

At time t35, the read signal RD may be activated, and the logic circuit 76 may activate the latch signal LAT in response to the activated read signal RD and the deactivated enable signal ENA. The latch 74 may latch the output code ADJ' of the ALU 72 in response to the activated latch signal LAT, and the adjustment code ADJ may have a value Y.

At time t36, the second calibration code CAL2 may be changed, and accordingly, the output code ADJ' of the ALU 72 may have a value Z. At time t37, the read signal RD may be activated, and the logic circuit 76 may activate the latch signal LAT in response to the activated read signal RD and the deactivated enable signal ENA. The latch 74 may latch the output code ADJ' of the ALU 72 in response to the latch signal LAT, and the adjustment code ADJ may have a value Z.

Figure 9:
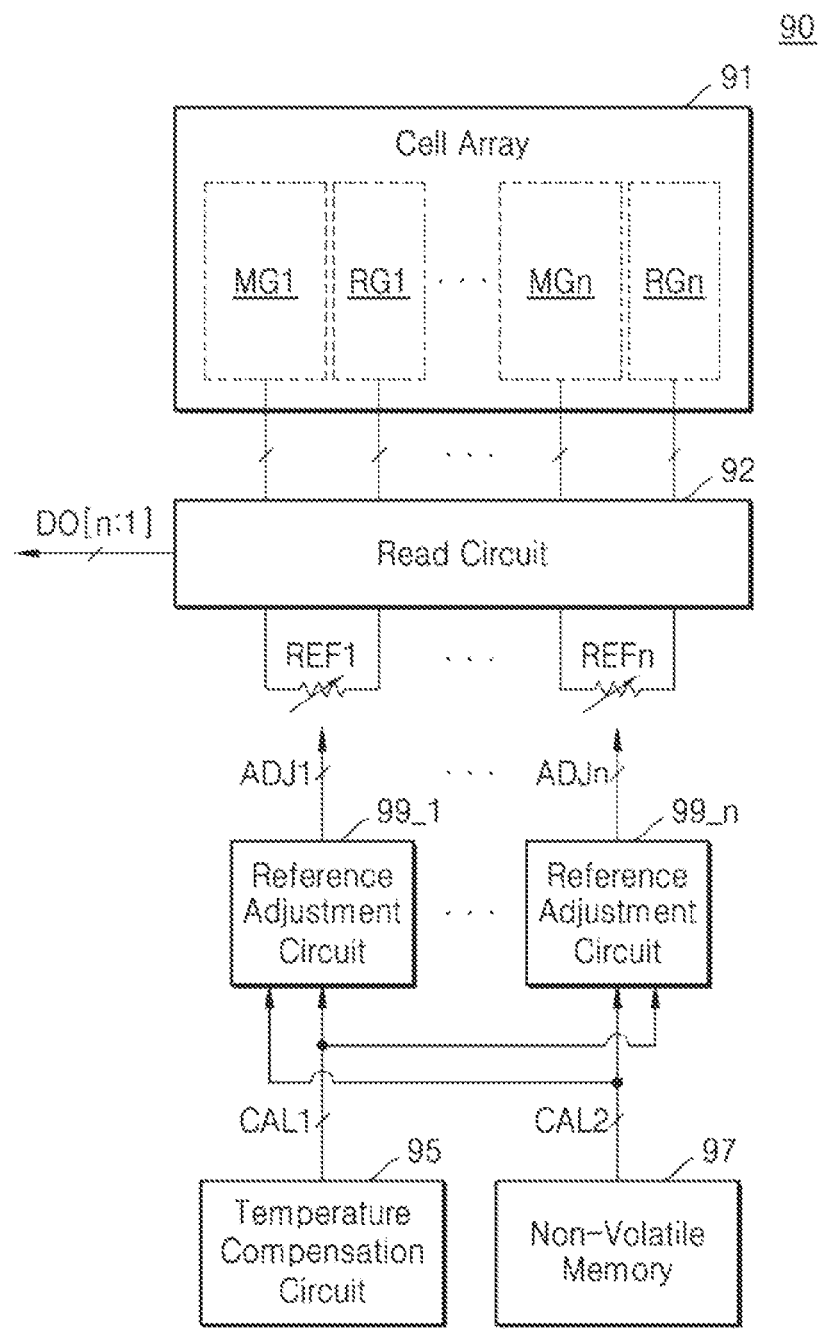
FIG. 9 is a block diagram of a memory device according to an example embodiment.

FIG. 9 is a block diagram of a memory device 90 according to an example embodiment. Compared with the memory device 10 of FIG. 1, the memory device 90 may include a plurality of reference resistors and a plurality of reference adjustment circuits. Referring to FIG. 9, the memory device 90 may include a cell array 91, a read circuit 92, first through n-th reference resistors REF1 through REFn, a temperature compensation circuit 95, a non-volatile memory 97, and first through n-th reference adjustment circuits 99_1 through 99_n (wherein, n is an integer greater than 1). Hereinafter, descriptions of FIG. 9 that are the same as the descriptions of FIG. 1 will be omitted.

The cell array 91 may include first through n-th memory cell groups MG1 through MGn, and may include first through n-th reference groups RG1 through RGn respectively corresponding to the first through n-th memory cell groups MG1 through MGn. The read circuit 92 may output n-bit output data DO[n:1] by determining data stored in memory cells included in each of the first through n-th memory cell groups MG1 through MGn based on reference resistances, that is, resistances of the first through n-th reference resistors REF1 through REFn corresponding to each of the first through n-th memory cell groups MG1 through MGn.

The first through n-th reference adjustment circuits 99_1 through 99_n may respectively generate first through n-th adjustment codes ADJ1 through ADJn to adjust the first through n-th reference resistors REF1 through REFn. As illustrated in FIG. 9, the first through n-th reference adjustment circuits 99_1 through 99_n may commonly receive the first calibration code CAL1 from the temperature compensation circuit 95, and may commonly receive the second calibration code CAL2 from the non-volatile memory 97.

Each of the first through n-th memory cell groups MG1 through MGn and/or the first through n-th reference groups RG1 through RGn may have a deviation, and the deviation may be referred to as a local variation or an input/output (IO) variation. The first through n-th reference adjustment circuits 99_1 through 99_n may commonly compensate for a temperature variation and a process variation based on the first calibration code CAL1 and the second calibration code CAL2, and may respectively generate first through n-th adjustment signals ADJ1 through ADJn that are respectively unique to the first through n-th reference resistors REF1 through REFn to compensate for the local variation. Accordingly, the first through n-th reference resistors REF1 through REFn may each have a unique reference resistance. Examples of the first through n-th reference adjustment circuits 99_1 through 99_n will be described with reference to FIGS. 10A and 10B.

Figure 10A:
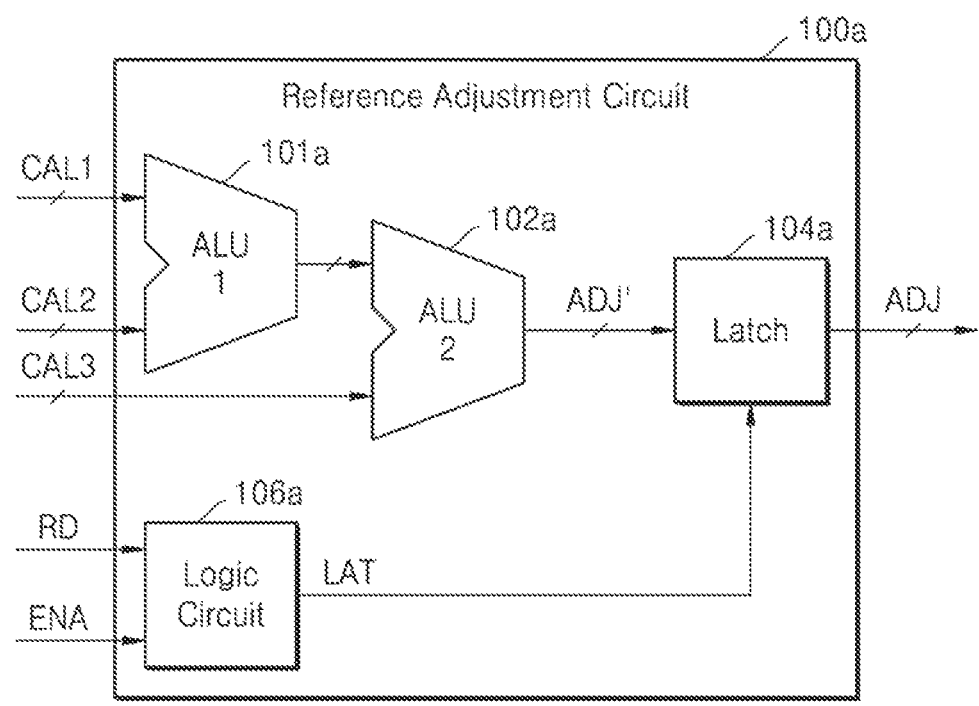
FIGS. 10A and 10B are block diagrams of examples of a reference adjustment circuit according to example embodiments.
Figure 10B:
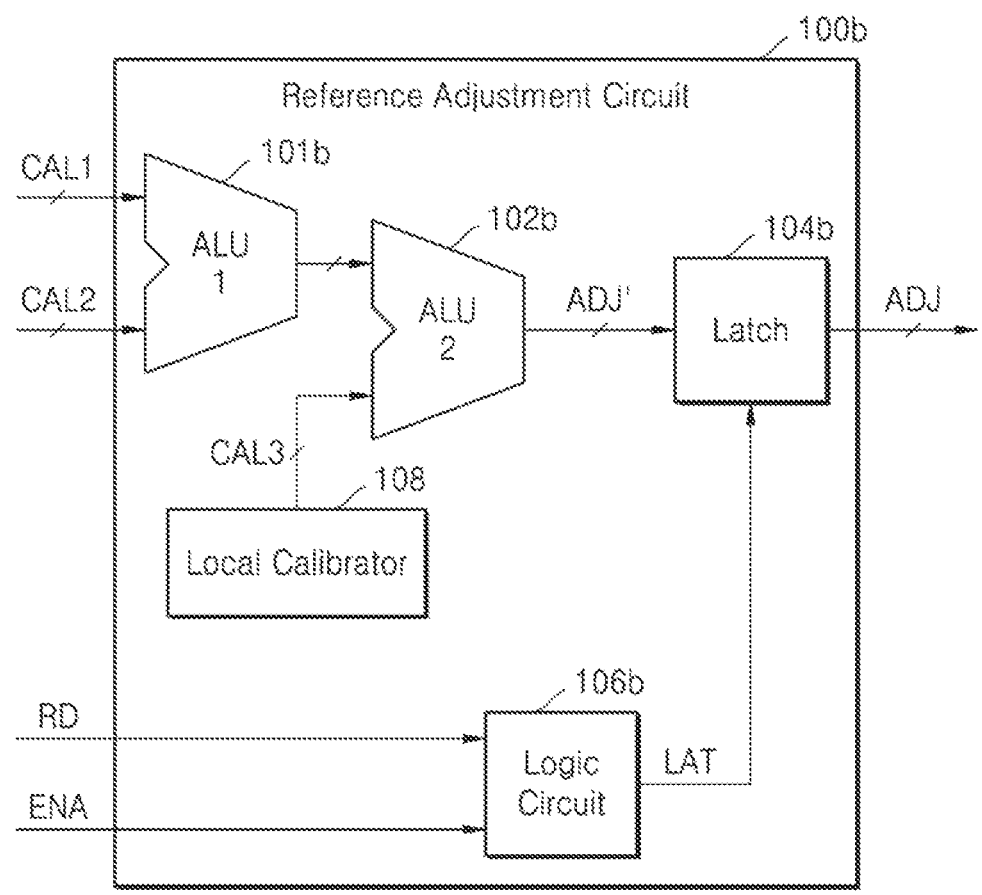

FIGS. 10A and 10B are block diagrams of examples of a reference adjustment circuit according to example embodiments. In detail, FIGS. 10A and 10B illustrate examples of one of the first through n-th reference adjustment circuits 99_1 through 99_n. Similar to the reference adjustment circuit 70 of FIG. 7, reference adjustment circuits 100a and 100b may receive the first and second calibration codes CAL1 and CAL2, the read signal RD, and the enable signal ENA, and may generate the adjustment code ADJ. Hereinafter, the descriptions of FIG. 7 that are substantially the same as those of FIGS. 10A and 10B are omitted.

Referring to FIG. 10A, the reference adjustment circuit 100a may include a first ALU 101a, a second ALU 102a, a latch 104a, and a logic circuit 106a. The reference adjustment circuit 100a may receive not only the first and second calibration codes CAL1 and CAL2, but also receive the third calibration code CAL3 for compensating a local variation. For example, the non-volatile memory 97 of FIG. 9 may generate the third calibration code CAL3, which is unique to each of the first through n-th reference adjustment circuits 99_1 through 99_n. The third calibration code CAL3 may be generated by testing the memory device 90 of FIG. 9. For example, the memory device 90 may be tested in a manufacturing process, and n third calibration codes corresponding to a test result may be written to the non-volatile memory 97.

Similar to the temperature variation and the process variation, the third calibration code CAL3 may be used as a multi-bit signal to compensate for the local variation, and may be arithmetically operated with the first and second calibration codes CAL1 and CAL2 to generate the adjustment code ADJ. For example, as illustrated in FIG. 10A, the first ALU 101a may perform an arithmetic operation on the first and second calibration codes CAL1 and CAL2, and the second ALU 102a may generate the output code ADJ' by perform an arithmetic operation on an output code of the first ALU 101a and the third calibration code CAL3. Herein, the first and second ALUs 101a and 102a may be collectively referred to as an ALU.

Referring to FIG. 10B, the reference adjustment circuit 100b may include a first ALU 101b, a second ALU 102b, a latch 104b, a logic circuit 106b, and a local calibrator 108. Compared with the reference adjustment circuit 100a of FIG. 10A, the third calibration code CAL3 of FIG. 10B may be generated in the reference adjustment circuit 100b. For example, the memory device 90 of FIG. 9 may be set to a test mode, and the local calibrator 108 may, in the test mode, test a memory cell group and a reference cell group, which correspond to the reference adjustment circuit 100b, to generate the third calibration code CAL3. The local calibrator 108 may include a latch (or register) storing the third calibration code CAL3, and may provide the third calibration code CAL3 to the second ALU 102b when the test mode is released. The test mode may be set during the manufacturing process of the memory device 90, may be set periodically, and may be set when power is supplied to the memory device 90.

Figure 11:
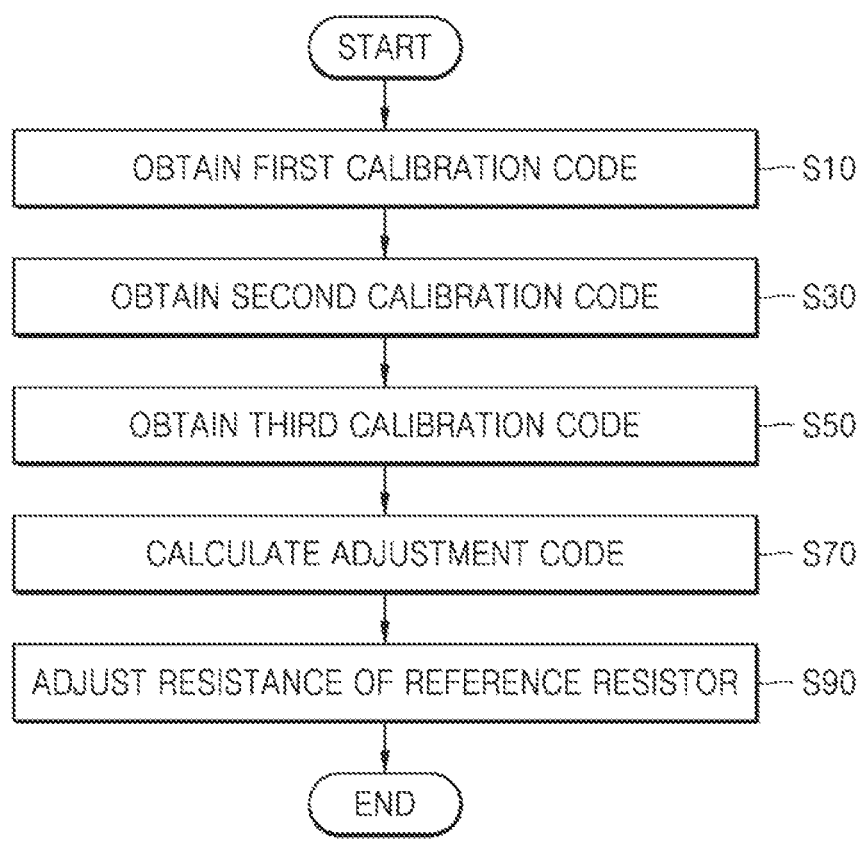
FIG. 11 is a flowchart of a method of calibrating a reference resistor, according to an example embodiment.

FIG. 11 is a flowchart of a method of calibrating a reference resistor, according to an example embodiment. As illustrated in FIG. 11, the method of calibrating the reference resistor may include a plurality of operations S10, S30, S50, S70, and S90. In some embodiments, the method of FIG. 11 may be performed by the memory device 90 of FIG. 9. In addition, in some embodiments, operation S50 may be omitted. In this case, the method of FIG. 11 may be performed by the memory device 10 of FIG. 1. Hereinafter, FIG. 11 is described with reference to FIG. 9.

In operation S10, an operation of obtaining the first calibration code CAL1 may be performed. The first calibration code CAL1 may correspond to a temperature variation, and may have a value for compensating for the temperature variation. As described above with reference to FIG. 9, the first calibration code CAL1 may be shared by the first through n-th reference adjustment circuits 99_1 through 99_n. An example of operation S10 will be described below with reference to FIG. 12.

In operation S30, an operation of obtaining the second calibration code CAL2 may be performed. The second calibration code CAL2 may correspond to a process variation, and may have a value for compensating for the process variation. Similar to the first calibration code CALL the second calibration code CAL2 may be shared by the first through n-th reference adjustment circuits 99_1 through 99_n, and the first through n-th reference adjustment circuits 99_1 through 99_n may read the second calibration code CAL2 from the non-volatile memory 97.

In operation S50, an operation of obtaining the third calibration code CAL3 may be performed. The third calibration code CAL3 may correspond to a local variation, and may have a value for compensating for the local variation. Each of the first through n-th reference adjustment circuits 99_1 through 99_n may obtain a unique third calibration code CAL3. For example, a reference adjustment circuit may receive the third calibration code CAL3 from the outside as described above with reference to FIG. 10A, and may generate the third calibration code CAL3 therein as described above with reference to FIG. 10B.

In operation S70, an operation of generating or calculating the adjustment code ADJ may be performed. For example, each of the first through n-th reference adjustment circuits 99_1 through 99_n may generate the adjustment code ADJ by performing an arithmetic operation on the first, second, and third calibration codes CAL1, CAL2, and CAL3. The adjustment code ADJ may compensate for all of the temperature variations, process variations, and local variations, and accordingly, structures configured to individually compensate for temperature variations, process variations, and local variations, such as analog circuits, may be omitted.

In operation S90, an operation of adjusting a resistance of the reference resistor REF may be performed. For example, the first through n-th reference adjustment circuits 99_1 through 99_n may respectively provide first through n-th adjustment codes ADJ1 through ADJn to the first through n-th reference resistors REF1 through REFn. The first through n-th reference resistors REF1 through REFn may respectively provide reference resistances, that is, resistances adjusted according to the first through n-th adjustment codes ADJ1 through ADJn. Due to the third calibration code CAL3 corresponding to the local variation, each of the first through n-th adjustment codes ADJ1 through ADJn may have a unique value, and accordingly, each of the first through n-th reference resistors REF1 through REFn may have a unique reference resistance.

Figure 12:
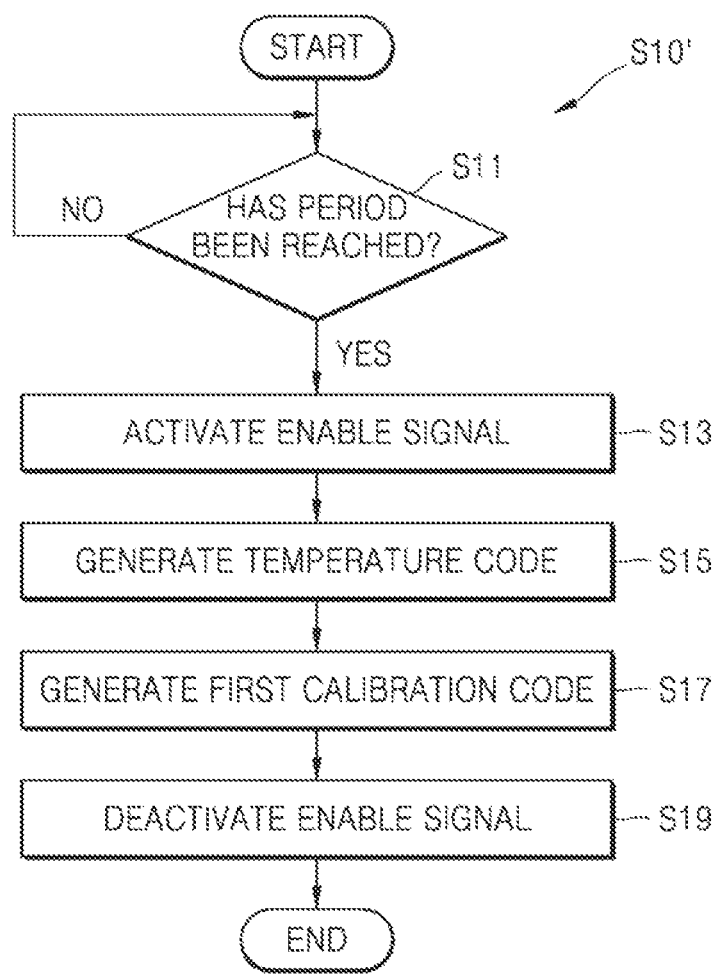
FIG. 12 is a flowchart of a method of calibrating a reference resistor, according to an example embodiment.

FIG. 12 is a flowchart of a method of calibrating a reference resistor, according to an example embodiment. In detail, the flowchart of FIG. 12 illustrates an example of operation S10 of FIG. 11. As described above with reference to FIG. 11, an operation of obtaining the first calibration code CAL1 may be performed in operation S10'. As illustrative in FIG. 12, operation S10' may include a plurality of operations S11, S13, S15, S17, and S19. In some embodiments, operation S10' may be performed by the temperature compensation circuit 20 of FIG. 2. Hereinafter, FIG. 12 will be described with reference to FIG. 2.

In operation S11, an operation of determining whether a period has been reached may be performed. For example, the controller 22 may include the ring oscillator, and the ring oscillator may generate signals that oscillate at a constant period, that is, the first through fifth signals D1 through D5. The period in which the first through fifth signals D1 through D5 oscillate may depend on the speed at which the temperature of a memory device may be changed, for example, several microseconds or several milliseconds. As illustrated in FIG. 12, when the period is reached, operation S13 may be performed subsequently.

In operation S13, an operation of activating the enable signal ENA may be performed. For example, the logic circuit 22_6 may include a plurality of logic gates, and may generate the enable signal ENA, which is activated from the first through fifth signals D1 through D5 provided from the ring oscillator. In addition, the logic circuit 22_6 may generate the clock signal CLK for the temperature sensor 24 to sense the temperature.

In operation S15, an operation of generating the temperature code TEM may be performed. For example, the temperature sensor 24 may sense the temperature in response to an activated enable signal ENA, and may generate the temperature code TEM corresponding to the sensed temperature. The temperature sensor 24 may have any structure sensing the temperature, and in some embodiments, as described above with reference to FIGS. 4A and 4B, the temperature sensor 24 may generate the temperature code TEM based on the clock signal CLK based on the binary search or the successive approximation.

In operation S17, an operation of generating the first calibration code CAL1 may be performed. For example, the encoder 26 may generate the first calibration code CAL1 from the temperature code TEM provided from the temperature sensor 24. For example, as described above with reference to FIG. 5, the encoder 26 may generate, from the temperature code TEM, the first calibration code CALL which is non-linear to temperature, to compensate for a deviation in leakage current occurring at a high temperature between a memory cell and a reference cell.

In operation S19, an operation of deactivating the enable signal ENA may be performed. For example, the logic circuit 22_6 may generate a deactivated enable signal ENA based on the first through fifth signals D1 through D5. As described above with reference to FIG. 3, the period in which the enable signal ENA is activated, that is, the first period P1, may be much shorter than the period of operation S11, that is, the sum of the first period P1 and the second period P2, and the enable signal ENA may have a very low duty cycle. Accordingly, time, power, or the like consumed in generating the first calibration code CAL1 corresponding to the temperature variation may be reduced.

Figure 13:
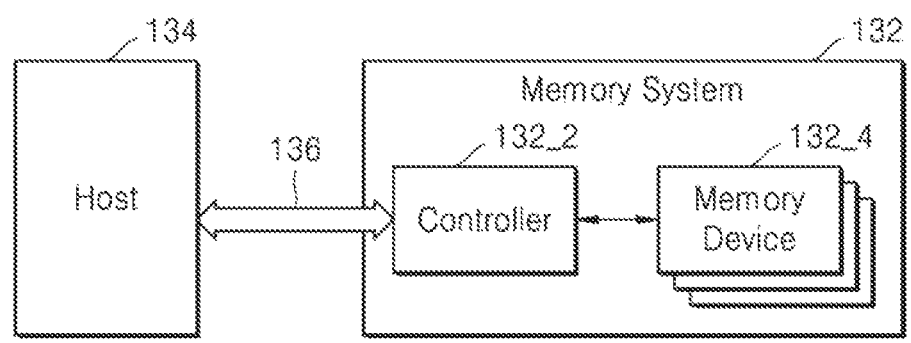
FIG. 13 is a block diagram of a memory system including a memory device according to an example embodiment.

FIG. 13 is a block diagram of a memory system 132 including a memory device according to an example embodiment. As illustrated in FIG. 13, the memory system 132 may communicate with a host 134, and may include a controller 132_2 and a memory device 132_4.

An interface 136 through which the memory system 132 and the host 134 communicate may use electrical signals and/or optical signals through wire or wirelessly, and may include, as a non-limiting example, a serial advanced technology attachment (SATA) interface, an SATA express (SATAe) interface, a serial attached small computer system (SAS) interface; a (serial attached SCSI) interface, a peripheral component interconnect express (PCIe) interface, a non-volatile memory express (NVMe) interface, an advanced host controller interface (AHCI), or a combination thereof.

In some embodiments, the memory system 132 may communicate with the host 134 by being removably coupled to the host 134. The memory device 132_4 may be a non-volatile memory as a resistive memory, and the memory system 132 may be referred to as a storage system. For example, the memory system 132 may include, as a non-limiting example, a solid-state drive or solid-state disk (SSD), an embedded SSD (eSSD), a multimedia card (MMC), an embedded multimedia card (eMMC), or the like.

The controller 132_2 may control the memory device 132_4 in response to a request received from the host 134 through the interface 136. For example, the controller 132_2 may, in response to a write request, write data received with the write request to the memory device 132_4, and may provide data stored in the memory device 132_4 to the host 134 in response to a read request.

The memory system 132 may include at least one memory device 132_4, and the memory device 132_4 may include a memory cell and a reference cell, the memory cell having a variable resistance element. As described above with reference to drawings, the memory device 132_4 may adjust a resistance of a reference resistor, that is, a reference resistance, to compensate for various variations, and accordingly, the cost for compensating for the variations, such as time, power, area, or the like may be reduced. As a result, the efficiency, performance, and reliability of the memory system 132 may be improved at the same time.

Figure 14:
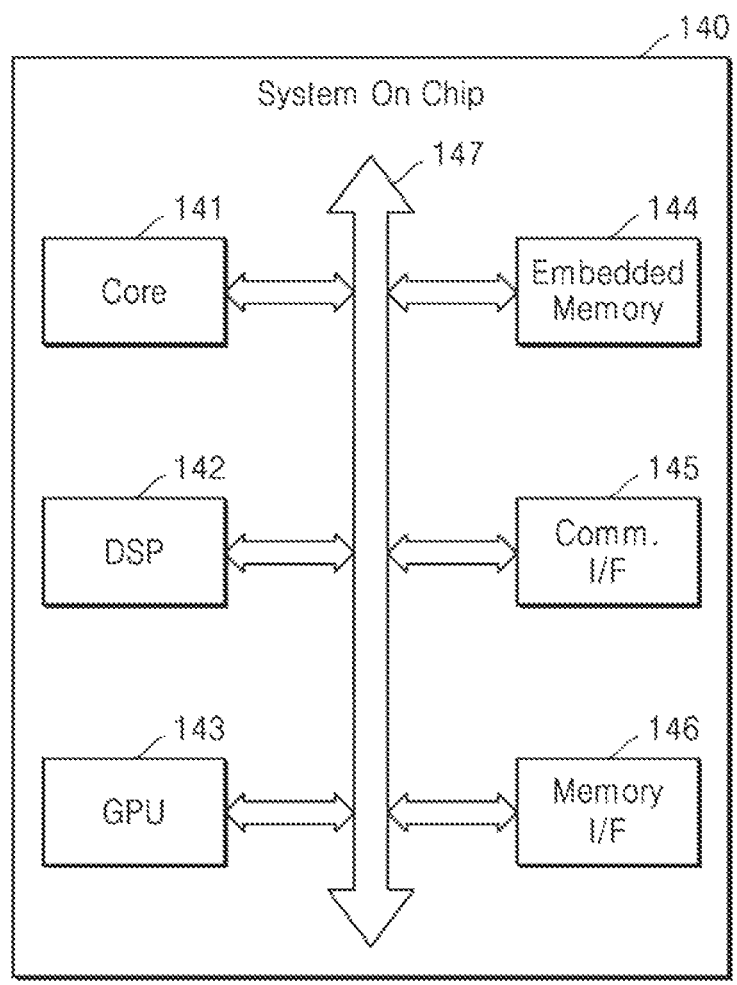
FIG. 14 is a block diagram of a system-on-chip including a memory device according to an example embodiment.

FIG. 14 is a block diagram of a system-on-chip (SoC) 140 including a memory device according to an example embodiment. The SoC 140 may be referred to as an integrated circuit in which components of a computing system or other electronic systems are integrated. For example, an application processor (AP), as one of the SoC 140, may include a processor and components for other functions. As illustrated in FIG. 14, the SoC 140 may include a core 141, a digital signal processor (DSP) 142, a graphics processing unit (GPU) 143, an embedded memory 144, a communication interface (I/F) 145, and a memory interface (I/F) 146. Components of the SoC 140 may communicate with each other through a bus 147.

The core 141 may process commands and control operations of the components included in the SoC 140. For example, the core 141 may drive an operating system and execute applications on the operating system by processing a series of commands. The DSP 142 may generate useful data by processing a digital signal, for example, a digital signal provided from the communication interface 145. The GPU 143 may generate, from image data provided from the memory interface 146, data for an image output through a display device, and may encode the image data. The communication interface 145 may provide an interface for a communication network or one-to-one communication. The memory interface 146 may provide an interface with respect to an external memory of the SoC 140, for example, dynamic random access memory (DRAM), flash memory, or the like.

The embedded memory 144 may store data used for the core 141, the DSP 142, and the GPU 143 to operate. The embedded memory 144 may include a resistive memory device according to an example embodiment, and accordingly, the embedded memory 144 may simply and accurately compensate for various variations and may provide improved efficiency, performance, and reliability. As a result, the efficiency, performance, and reliability of the SoC 140 may be improved.

While the inventive concept has been shown and described with reference to embodiments thereof, it will be understood that various changes in form and details may be made therein without departing from the spirit and scope of the following claims.

What is claimed is:

1. A memory device comprising:
  a cell array comprising a memory cell that comprises a variable resistance element;
  a reference resistor configured to provide a resistance varying according to an adjustment code;
  a read circuit configured to read data that is stored in the memory cell, based on a resistance of the variable resistance element and the resistance of the reference resistor; and
  a reference adjustment circuit configured to:
    obtain a first calibration code corresponding to a temperature of the memory device and a deviation in a temperature characteristic between the memory cell and a reference cell of the memory device, and a second calibration code corresponding to a process variation; and
    perform an arithmetic operation on the obtained first calibration code and the obtained second calibration code, to obtain the adjustment code.

2. The memory device of claim 1, further comprising a temperature compensation circuit configured to obtain the first calibration code,
  wherein the temperature compensation circuit comprises:
    a controller configured to generate an enable signal that is periodically activated; and
    a temperature sensor configured to, in response to the activated enable signal, sense the temperature of the memory device and generate a temperature code.

3. The memory device of claim 2, wherein the controller is further configured to generate a clock signal oscillating while the enable signal is activated, and wherein the temperature sensor is further configured to, in response to the clock signal, sequentially determine bits of the temperature code.

4. The memory device of claim 2, wherein the temperature sensor is further configured to generate the temperature code, based on a difference between a proportional-to-absolute-temperature (PTAT) current and a complementary-to-absolute-temperature (CTAT) current.

5. The memory device of claim 2, wherein the temperature sensor is further configured to adjust an offset of the temperature code, based on an offset code.

6. The memory device of claim 2, wherein the cell array further comprises the reference cell electrically connected to the reference resistor during a read operation, and
wherein the temperature compensation circuit further comprises an encoder configured to add, to the temperature code, a code corresponding to the deviation in the temperature characteristic between the memory cell and the reference cell, to obtain the first calibration code.

7. The memory device of claim 2, wherein the enable signal has a duty cycle of 5% or less.

8. The memory device of claim 2, wherein the reference adjustment circuit comprises:
an arithmetic logic unit (ALU) configured to perform the arithmetic operation; and
a latch configured to:
store an output of the ALU;
output the adjustment code; and
update the adjustment code while the enable signal is deactivated.

9. The memory device of claim 1, further comprising a non-volatile memory storing the second calibration code.

10. The memory device of claim 1, wherein the reference adjustment circuit is further configured to obtain the adjustment code by performing the arithmetic operation on the obtained first calibration code, the obtained second calibration code, and a third calibration code corresponding to a local variation in the memory device.

11. A memory device comprising:
a cell array comprising a first memory cell group and a second memory cell group;
a first reference resistor configured to provide a first resistance varying according to a first adjustment code, to read first data that is stored in the first memory cell group;
a second reference resistor configured to provide a second resistance varying according to a second adjustment code, to read second data that is stored in the second memory cell group;
a first reference adjustment circuit configured to:
obtain a first calibration code corresponding to a temperature variation, and a second calibration code corresponding to a process variation; and
perform a first arithmetic operation on the obtained first calibration code, the obtained second calibration code, and a third calibration code corresponding to a first characteristic of the first memory cell group, to obtain the first adjustment code; and
a second reference adjustment circuit configured to perform a second arithmetic operation on the obtained first calibration code, the obtained second calibration code, and a fourth calibration code corresponding to a second characteristic of the second memory cell group, to obtain the second adjustment code.

12. The memory device of claim 11, further comprising a non-volatile memory storing the third calibration code and the fourth calibration code,
wherein the first reference adjustment circuit and the second reference adjustment circuit are further configured to, based on power being supplied to the memory device, respectively obtain the third calibration code and the fourth calibration code from the non-volatile memory.

13. The memory device of claim 11, wherein the first reference adjustment circuit comprises a first local calibrator configured to, based on power being supplied to the memory device, test the first memory cell group to obtain the third calibration code, and
wherein the second reference adjustment circuit comprises a second local calibrator configured to, based on the power being supplied to the memory device, test the second memory cell group to obtain the fourth calibration code.

14. The memory device of claim 11, further comprising a temperature compensation circuit configured to obtain the first calibration code,
wherein the temperature compensation circuit comprises:
a controller configured to generate an enable signal that is periodically activated; and
a temperature sensor configured to generate, in response to the activated enable signal, sense a temperature of the memory device, to obtain a temperature code.

15. The memory device of claim 14, wherein the temperature compensation circuit further comprises an encoder configured to obtain the first calibration code that is non-linear to the sensed temperature, based on the temperature code.

16. The memory device of claim 11, further comprising a non-volatile memory storing the second calibration code.

17. A method of calibrating a reference resistor comprised in a resistive memory device, the method comprising:
obtaining a first calibration code corresponding to a temperature of the resistive memory device and a deviation in a temperature characteristic between a memory cell of the resistive memory device and a reference cell of the resistive memory device;
obtaining a second calibration code corresponding to a process variation;
performing an arithmetic operation on the obtained first calibration code and the obtained second calibration code, to obtain an adjustment code; and
adjusting a resistance of the reference resistor, based on the obtained adjustment code.

18. The method of claim 17, wherein the obtaining of the first calibration code comprises:
generating an enable signal that is periodically activated; and
in response to the activated enable signal, sensing the temperature of the resistive memory device, to obtain a temperature code.

19. The method of claim 18, wherein the obtaining of the first calibration code further comprises obtaining the first calibration code that is non-linear to the sensed temperature, based on the temperature code.

20. The method of claim 17, wherein the performing of the arithmetic operation comprises performing the arithmetic operation on the obtained first calibration code, the obtained second calibration code, and a third calibration code corresponding to a local variation in the resistive memory device.

\* \* \* \* \*